United States Patent
Hsiao et al.

(10) Patent No.: US 10,192,832 B2
(45) Date of Patent: Jan. 29, 2019

(54) ALIGNMENT MARK STRUCTURE WITH DUMMY PATTERN

(71) Applicant: United Microelectronics Corp., Hsinchu (TW)

(72) Inventors: Kai-Jen Hsiao, Nantou County (TW); Chun-Yun Tsai, Hsinchu (TW); Cheng-Yi Hsu, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 21 days.

(21) Appl. No.: 15/238,595

(22) Filed: Aug. 16, 2016

(65) Prior Publication Data
US 2018/0053729 A1    Feb. 22, 2018

(51) Int. Cl.
*H01L 23/544*    (2006.01)
*H01L 23/31*    (2006.01)
*H01L 23/29*    (2006.01)

(52) U.S. Cl.
CPC ......... *H01L 23/544* (2013.01); *H01L 23/291* (2013.01); *H01L 23/3171* (2013.01); *H01L 2223/5442* (2013.01); *H01L 2223/54426* (2013.01)

(58) Field of Classification Search
CPC . H01L 23/544; H01L 23/291; H01L 23/3171; H01L 2223/5442; H01L 2223/54426

USPC .......................................................... 257/737
See application file for complete search history.

(56) References Cited

U.S. PATENT DOCUMENTS

| | | | | |
|---|---|---|---|---|
| 3,801,880 A | * | 4/1974 | Harada | H01L 21/00 257/752 |
| 7,312,530 B2 | * | 12/2007 | Hashimoto | H01L 24/03 257/758 |
| 8,421,250 B2 | | 4/2013 | Koketsu et al. | |
| 8,853,868 B2 | | 10/2014 | Pratt et al. | |
| 9,024,456 B2 | | 5/2015 | Yang et al. | |
| 2005/0082577 A1 | * | 4/2005 | Usui | H01L 24/05 257/211 |
| 2005/0269702 A1 | * | 12/2005 | Otsuka | H01L 21/76801 257/750 |
| 2007/0210442 A1 | * | 9/2007 | Hess | H01L 23/522 257/700 |
| 2009/0134531 A1 | * | 5/2009 | Yang | H01L 23/544 257/797 |
| 2009/0206411 A1 | * | 8/2009 | Koketsu | H01L 23/544 257/368 |
| 2015/0108611 A1 | * | 4/2015 | Kumagai | H01L 23/5226 257/620 |

* cited by examiner

*Primary Examiner* — Joseph C Nicely
(74) *Attorney, Agent, or Firm* — J.C. Patents

(57) ABSTRACT

An alignment mark structure including a substrate, an alignment mark and at least one dummy pattern is provided. The alignment mark is disposed on the substrate. The at least one dummy pattern is disposed on the substrate and located adjacent to the alignment mark, wherein a size of the at least one dummy pattern is smaller than a size of the alignment mark.

13 Claims, 2 Drawing Sheets

ALIGNMENT MARK STRUCTURE WITH DUMMY PATTERN

BACKGROUND OF THE INVENTION

Field of the Invention

The invention relates to a semiconductor structure, and particularly relates to an alignment mark structure.

Description of Related Art

In the semiconductor process, the alignment mark is used to align the position of the wafer or the chip. Moreover, the alignment process of the packaging process is related to the overall product quality. However, if the contrast of the alignment mark is low, the alignment process is easy to fail. Therefore, when the alignment process of the packaging process is performed, the wafer or the chip can not be precisely aligned.

SUMMARY OF THE INVENTION

The invention provides an alignment mark structure which can have a higher contrast.

The invention provides an alignment mark structure including a substrate, an alignment mark and at least one dummy pattern. The alignment mark is disposed on the substrate. The at least one dummy pattern is disposed on the substrate and located adjacent to the alignment mark, wherein a size of the at least one dummy pattern is smaller than a size of the alignment mark.

According to an embodiment of the invention, in the alignment mark structure, the alignment mark includes a metal layer.

According to an embodiment of the invention, in the alignment mark structure, the metal layer is derived from a top metal layer, for example.

According to an embodiment of the invention, in the alignment mark structure, a material of the metal layer can include Al—Cu alloy.

According to an embodiment of the invention, in the alignment mark structure, a shape of the alignment mark is a cross shape or a polygon, for example.

According to an embodiment of the invention, in the alignment mark structure, the polygon is a triangle, a quadrangle, a pentagon or a hexagon, for example.

According to an embodiment a the invention, in the alignment mark structure, the at least one dummy pattern includes a metal layer.

According to an embodiment of the invention, in the alignment mark structure, the metal layer is derived from a top metal layer, for example.

According to an embodiment of the invention, in the alignment mark structure, a material of the metal layer can include Al—Cu alloy.

According to an embodiment of the invention, in the alignment mark structure, a shape of the at least one dummy pattern is a polygon, for example.

According to an embodiment of the invention, in the alignment mark structure, the polygon is a triangle, a quadrangle, a pentagon or a hexagon, for example.

According to an embodiment of the invention, in the alignment mark structure, a metal layer of the alignment mark and a metal layer of the at least one dummy pattern can be derived from the same metal layer, for example.

According to an embodiment of the invention, in the alignment mark structure, the number of the at least one dummy pattern is a plurality, for example.

According to an embodiment of the invention, in the alignment mark structure, the dummy patterns are arranged in a matrix or in a random arrangement, for example.

According to an embodiment of the invention, the alignment mark structure can further include a passivation layer, wherein the passivation layer covers the at least one dummy pattern.

According to an embodiment of the invention, in the alignment mark structure, the passivation layer can further cover the alignment mark.

According to an embodiment of the invention, in the alignment mark structure, a material of the passivation layer is silicon oxide, for example.

According to an embodiment of the invention, in the alignment mark structure, a contrast between the alignment mark and the at least one dummy pattern is greater than or equal to 2.5 when performing an alignment process, for example.

According to an embodiment of the invention, the alignment mark structure can be applied in a package alignment process, for example.

Based on the above description, the alignment mark structure has the at least one dummy pattern located adjacent to the alignment mark, wherein the size of the at least one dummy pattern is smaller than the size of the alignment mark, and thus a high contrast between the alignment mark and the at least one dummy pattern can be obtained. Therefore, the alignment mark structure can have a higher contrast, and the wafer or the chip can be precisely aligned by using the alignment mark structure.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
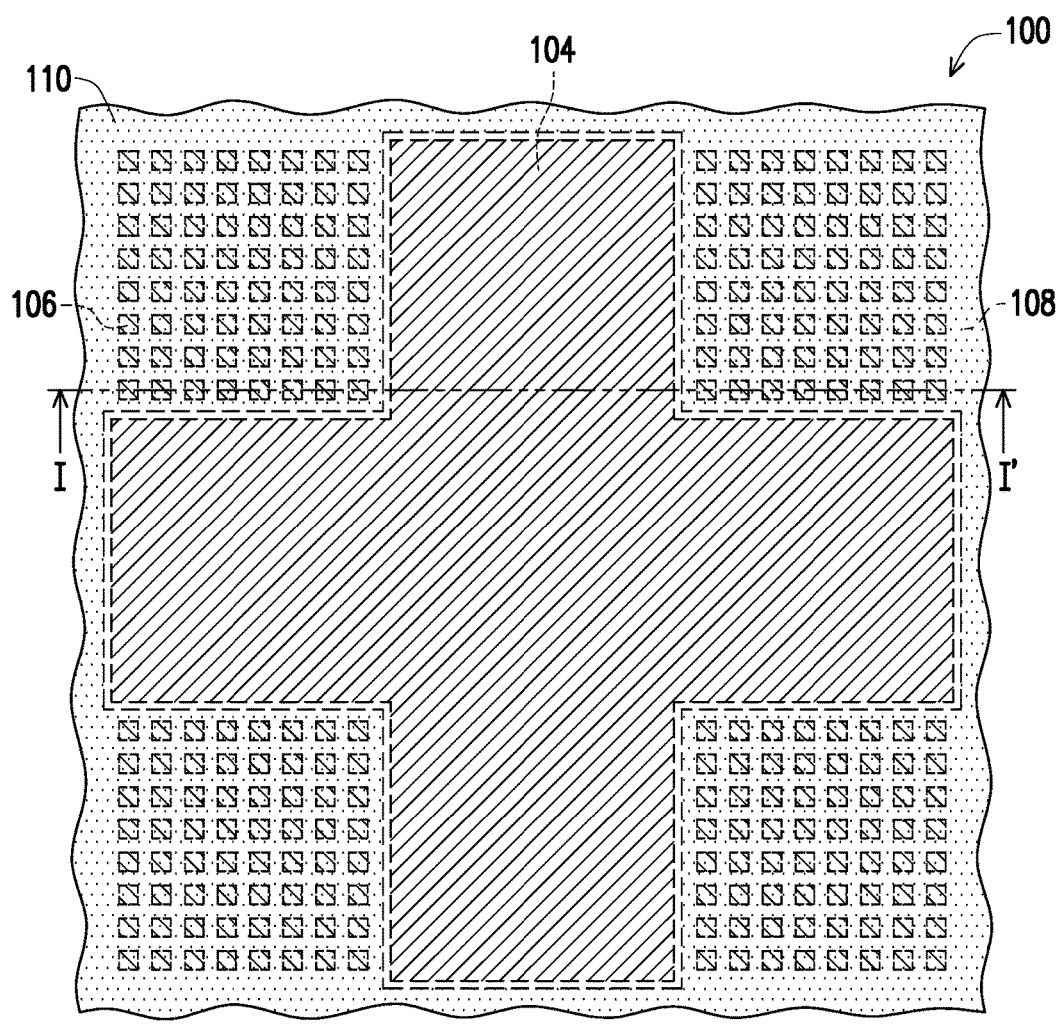
FIG. 1A. is a top view illustrating an alignment mark structure according to an embodiment of the invention.
Figure 1B:
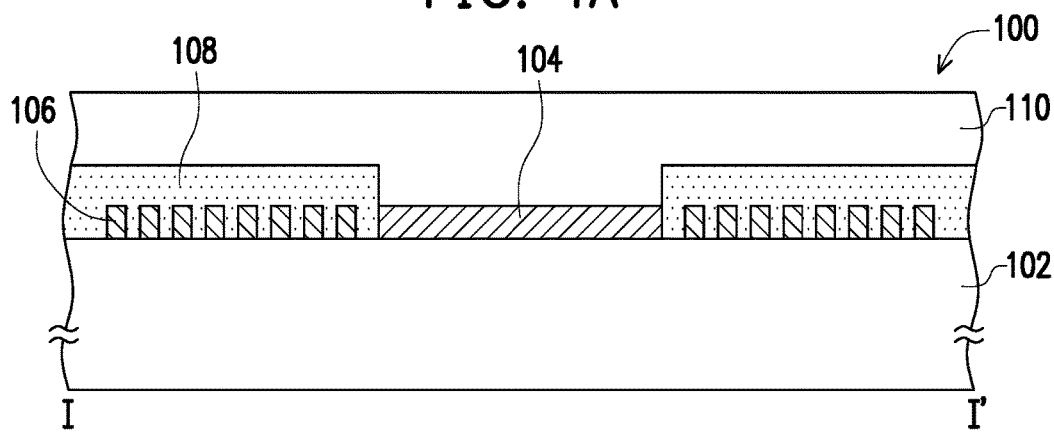
FIG. 1B. is a cross-sectional view taken along a sectional line I-I' depicted in FIG. 1A.

FIG. 1A. is a top view illustrating an alignment mark structure according to an embodiment of the invention. FIG. 1B. is a cross-sectional view taken along a sectional line I-I' depicted in FIG. 1A.

Referring to FIG. 1A and FIG. 1B, an alignment mark structure 100 includes a substrate 102, an alignment mark 104 and at least one dummy pattern 106. The alignment mark structure 100 can be applied in a package alignment process, for example. A person having ordinary skill in the art may form dielectric layers, interconnects and/or semiconductor devices (not shown) in the substrate 100 according to the product design requirements.

The alignment mark 104 is disposed on the substrate 102. The alignment mark 104 includes a metal layer. The metal layer is derived from a top metal layer, for example. The material of the metal layer can include Al—Cu alloy and can further include Ti/TiN. The method for forming the metal layer is a physical vapor deposition (PVD) method, for example. The shape of the alignment mark 104 is a cross shape or a polygon, for example. The polygon is a triangle, a quadrangle, a pentagon or a hexagon, for example. In this embodiment, the shape of the alignment mark 104 is exemplified as the cross shape, but the invention is not limited thereto.

The at least one dummy pattern 106 is disposed on the substrate 102 and located adjacent to the alignment mark 104, wherein a size of the at least one dummy pattern 106 is smaller than a size of the alignment mark 104. The at least one dummy pattern 106 can increase the contrast of the alignment mark structure 100. The number of the at least one dummy pattern 106 is a plurality, for example. When the number of the at least one dummy pattern 106 is plural, the dummy patterns 106 are arranged in a matrix or in a random arrangement, for example. In this embodiment, the arrangement of the dummy patterns 106 is exemplified as the matrix, but the invention is not limited thereto.

The dummy pattern 106 includes a metal layer. The metal layer of the alignment mark 104 and the metal layer of the at least one dummy pattern 106 can be derived from the same metal layer, for example. The metal layer is derived from a top metal layer, for example. The material of the metal layer can include Al—Cu alloy and can further include Ti/TiN. The method for forming the metal layer is a PVD method, for example. The shape of the dummy pattern 106 is a polygon, for example. The polygon is a triangle, a quadrangle, a pentagon or a hexagon, for example. In this embodiment, shape of the dummy pattern 106 is exemplified as the quadrangle, but the invention is not limited thereto.

Furthermore, the alignment mark structure 100 can further include a passivation layer 108, wherein the passivation layer 108 covers the dummy patterns 106. The material of the passivation layer 108 is silicon oxide, for example. The thickness of the passivation layer 108 is between 4000 angstroms (Å) and 8000 Å, but not limited to this. The method for forming the passivation layer 108 is a chemical vapor deposition (CVD) method, for example. In this embodiment, the passivation layer 108 covers the dummy patterns 106 and exposes the alignment mark 104, and thus a contrast between the alignment mark 104 and the dummy pattern 106 can be further increased.

Therefore, the alignment mark structure 100 can have a higher contrast.

Moreover, the alignment mark structure 100 can further include a passivation layer 110, wherein the passivation layer 110 covers the passivation layer 108 and the alignment mark 104. The material of the passivation layer 110 is silicon nitride, for example. The method for forming the passivation layer 110 is a CVD method, for example.

Besides, the contrast between the alignment mark 104 and the dummy pattern 106 is greater than or equal to 2.5 when performing an alignment process, for example.

Based on the aforementioned embodiment, the alignment mark structure 100 has the dummy pattern 106 located adjacent to the alignment mark 104, wherein the size of the dummy pattern 106 is smaller than the size of the alignment mark 104, and thus a high contrast between the alignment mark 104 and the dummy pattern 106 can be obtained. Therefore, the alignment mark structure 100 can have a higher contrast, and the wafer or the chip can be precisely aligned by using the alignment mark structure 100.

Figure 2A:
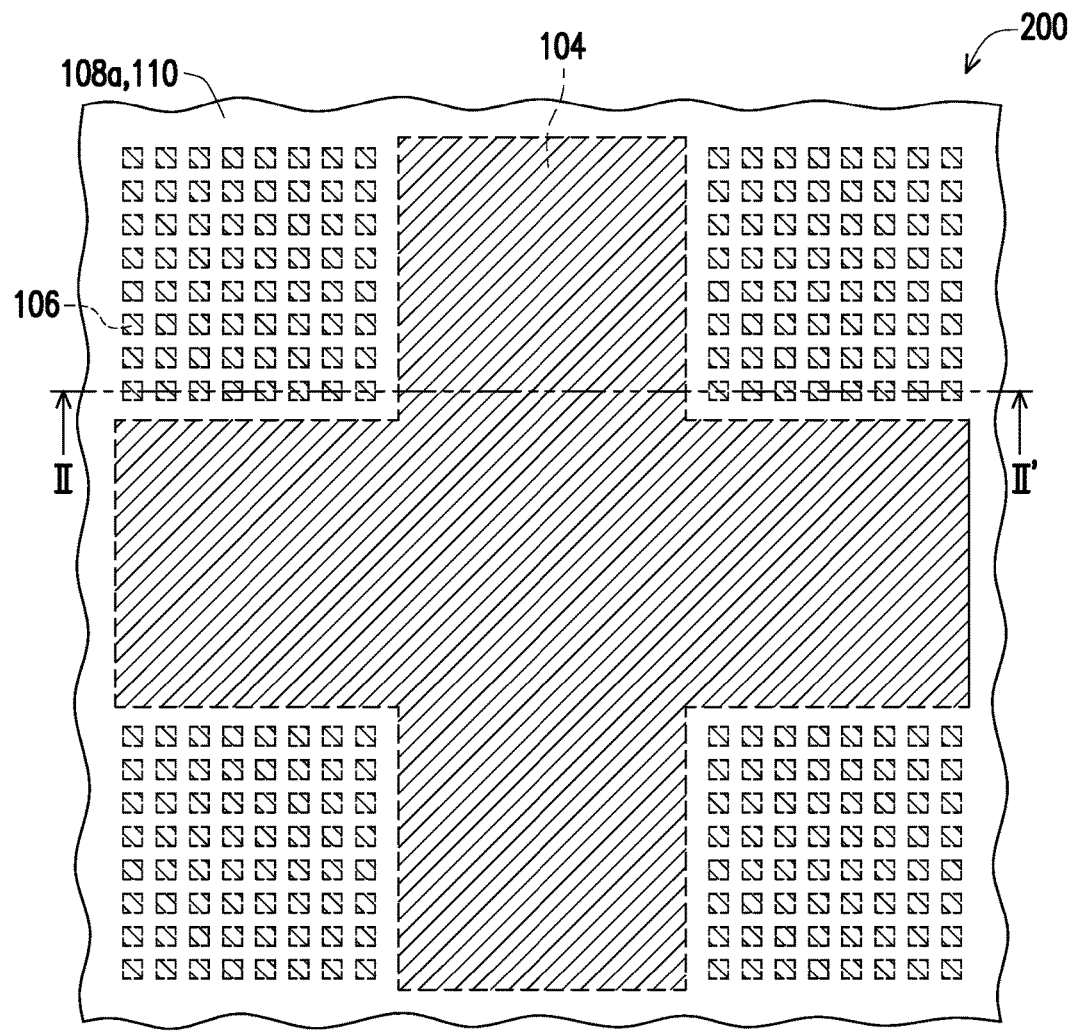
FIG. 2A. is a top view illustrating an alignment mark structure according to another embodiment of the invention.
Figure 2B:
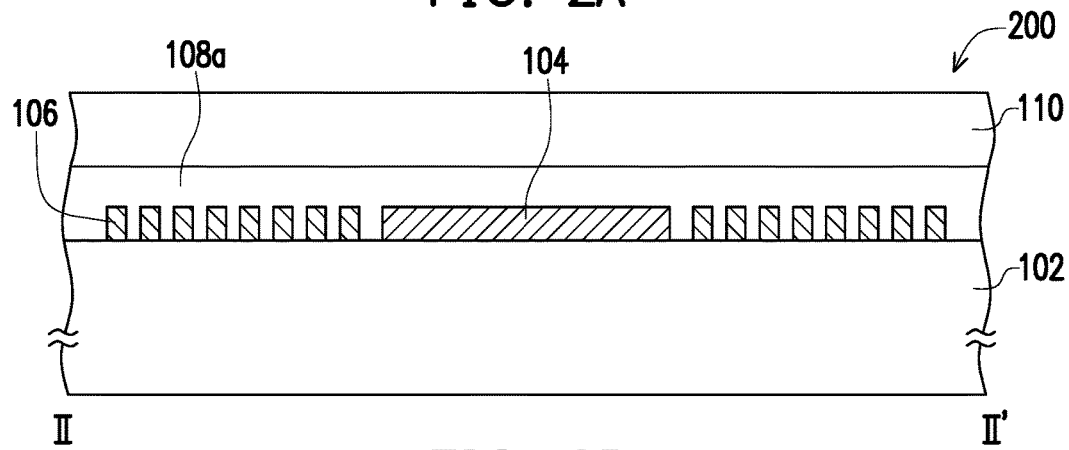
FIG. 2B. is a cross-sectional view taken along a sectional line II-II' depicted in FIG. 2A.

FIG. 2A. is a top view illustrating an alignment mark structure according to another embodiment of the invention. FIG. 2B. is a cross-sectional view taken along a sectional line II-II' depicted in FIG. 2A.

Referring to FIG. 1A, FIG. 1B, FIG. 2A, and FIG. 2B, a difference between the embodiment of FIG. 1A and FIG. 1B and the embodiment of FIG. 2A and FIG. 2B is described as follows. In an alignment mark structure 200 of FIG. 2A, and FIG. 2B, a passivation layer 108a can further cover the alignment mark 104. In another word, the passivation layer 108a covers both of the alignment mark 104 and the dummy patterns 106. Moreover, the passivation layer 110 covers the passivation layer 108a. In the embodiment of FIG. 2A, and FIG. 2B, since the dummy pattern 106 can increase the contrast of the alignment mark structure 200, it is not necessary to remove a portion of the passivation layer 108a to expose the alignment mark 104, and the alignment mark structure 200 can still have a sufficient contrast. Therefore, the complexity of the manufacturing process of the alignment mark structure 200 can be reduced. Components of the alignment mark structure 200 of FIG. 2A and FIG. 2B that are similar to those of the alignment mark structure 100 of FIG. 1A and FIG. 1B are assigned with the same reference numerals and detailed description thereof is omitted here.

In summary, in the alignment mark structure of the aforementioned embodiments, the at least one dummy pattern is located adjacent to the alignment mark, wherein the size of the at least one dummy pattern is smaller than the size of the alignment mark, and thus a high contrast between the alignment mark and the at least one dummy pattern can be obtained. Therefore, the alignment mark structure can have a higher contrast, and the wafer or the chip can be precisely aligned by using the alignment mark structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An alignment mark structure, comprising:
   a substrate;
   an alignment mark disposed on the substrate;
   dummy patterns disposed on the substrate and located adjacent to the alignment mark;
   a first passivation layer covering a top surface of the dummy patterns; and
   a second passivation layer covering the first passivation layer, wherein
   a size of the dummy patterns is smaller than a size of the alignment mark,
   a metal layer of the alignment mark and a metal layer of the dummy patterns are derived from the same metal layer, and
   the second passivation layer directly contacts and covers entire top surface of the alignment mark, and the first passivation layer does not cover any of the top surface of the alignment mark.

2. The alignment mark structure of claim 1, wherein the same metal layer is derived from a top metal layer.

3. The alignment mark structure of claim 1, wherein a material of the same metal layer comprises Al—Cu alloy.

4. The alignment mark structure of claim 1, wherein a shape of the alignment mark comprises a cross shape or a polygon.

5. The alignment mark structure of claim 4, wherein the polygon comprises a triangle, a quadrangle, a pentagon or a hexagon.

6. The alignment mark structure of claim 1, wherein a shape of the dummy patterns comprises a polygon.

7. The alignment mark structure of claim 6, wherein the polygon comprises a triangle, a quadrangle, a pentagon or a hexagon.

8. The alignment mark structure of claim 1, wherein the dummy patterns are arranged in a matrix or in a random arrangement.

9. The alignment mark structure of claim 1, wherein a material of the second passivation layer comprises silicon oxide.

10. The alignment mark structure of claim 1, wherein a contrast between the alignment mark and the dummy patterns is greater than or equal to 2.5 when performing an alignment process.

11. The alignment mark structure of claim 1, wherein the alignment mark structure is applied in a package alignment process.

12. The alignment mark structure of claim 1, wherein the dummy patterns are arranged in only one single layer.

13. An alignment mark structure, comprising:
a substrate;
an alignment mark disposed on the substrate;
at least one dummy pattern disposed on the substrate and located adjacent to the alignment mark, wherein
a size of the at least one dummy pattern is smaller than a size of the alignment mark;
a first passivation layer covering a top surface of the at least one dummy pattern; and
a second passivation layer covering the first passivation layer,
wherein the second passivation layer directly contacts and covers entire top surface of the alignment mark, and the first passivation layer does not cover any of the top surface of the alignment mark.

* * * * *